United States Patent
Kanda

[11] Patent Number: 5,974,065
[45] Date of Patent: Oct. 26, 1999

[54] SEMICONDUCTOR LASER MODULE

[75] Inventor: Masahiro Kanda, Tokyo, Japan

[73] Assignee: NEC Corporation, Tokyo, Japan

[21] Appl. No.: 08/819,009

[22] Filed: Mar. 17, 1997

[30] Foreign Application Priority Data

Mar. 15, 1996 [JP] Japan ................. 8-087600

[51] Int. Cl.$^6$ ............. H01S 3/18; H01S 3/04; G02B 6/36
[52] U.S. Cl. ............. 372/43; 372/34; 385/88; 385/92; 385/93
[58] Field of Search ............. 372/33, 34, 43, 372/36; 385/88, 92, 93

[56] References Cited

U.S. PATENT DOCUMENTS

| | | | |
|---|---|---|---|
| 4,752,109 | 6/1988 | Gordon et al. | 385/94 |
| 5,195,155 | 3/1993 | Shimaoka et al. | 382/88 |
| 5,216,737 | 6/1993 | Drissen et al. | 385/93 |
| 5,673,349 | 9/1997 | Kosugi | 385/92 |

FOREIGN PATENT DOCUMENTS

| | | | |
|---|---|---|---|
| 63-226987 | 9/1988 | Japan | 372/43 |
| 1-220491 | 9/1989 | Japan | 372/43 |
| 2-21680 | 1/1990 | Japan | 372/43 |
| 2-130987 | 5/1990 | Japan | 372/43 |
| 3100506 | 4/1991 | Japan . | |
| 3-132619 | 6/1991 | Japan | 372/43 |
| 5-150146 | 6/1993 | Japan . | |
| 5-226779 | 9/1993 | Japan . | |
| 7140361 | 6/1995 | Japan . | |
| 829648 | 2/1996 | Japan . | |

*Primary Examiner*—Rodney Bovernick
*Assistant Examiner*—Quyen Phan Leung
*Attorney, Agent, or Firm*—Sughrue, Mion, Zinn, Macpeak & Seas, PLLC

[57] ABSTRACT

A semiconductor laser module includes a flat board, a semiconductor laser, a lens, an optical fiber, a lens holder, an electronic cooling element, and support rods. The semiconductor laser is mounted on the board, and the laser emit a laser beam. The lens focuses the laser beam from the semiconductor laser. The optical fiber is optically coupled to the lens to receive the laser beam emitted from the semiconductor laser and focused by the lens. The lens holder holds the lens on the optical axis of the semiconductor laser. The electronic cooling element adjusts the temperature of the semiconductor laser, and the board is fixed to the upper surface of the electronic cooling element. The support rods support the lens holder at a position opposing a light-exit end face of the board.

6 Claims, 1 Drawing Sheet

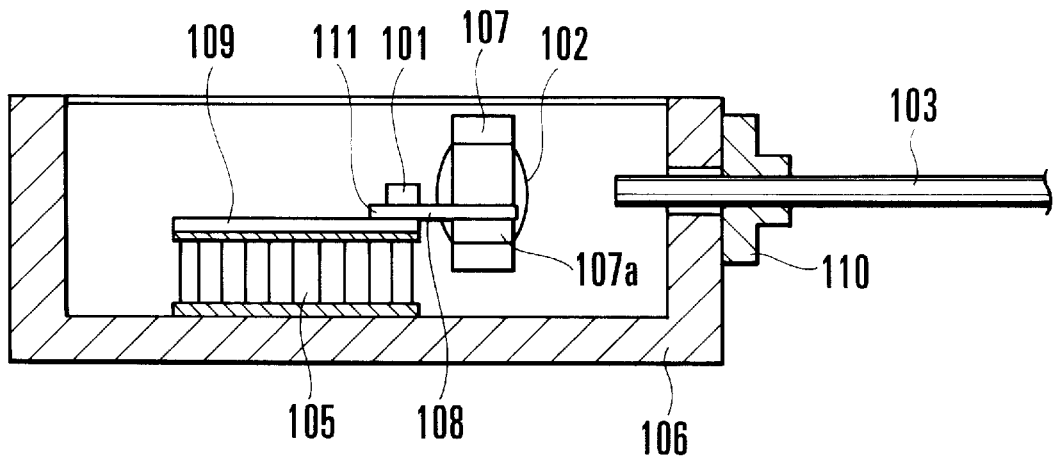
F I G. 1
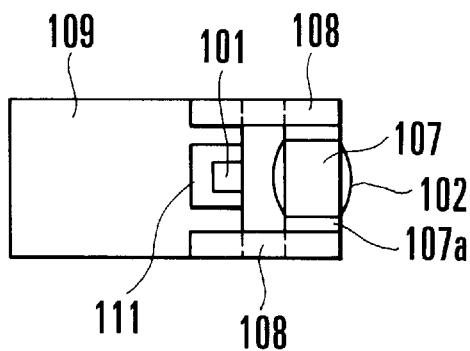
F I G. 2

SEMICONDUCTOR LASER MODULE

BACKGROUND OF THE INVENTION

The present invention relates to a semiconductor laser module having a temperature adjustment function suitable for optical communications, optical information processing, and the like.

A conventional semiconductor laser module of this type is used as a signal source of an optical fiber transmission unit or the like. The conventional semiconductor laser module is arranged as shown in FIG. 3. Referring to FIG. 3, reference numeral 1 denotes a semiconductor laser; 2, a lens for focusing a laser beam from the semiconductor laser 1; and 3, an optical fiber for optically coupling the beam emitted from the semiconductor laser 1 and focused and emerging from the lens 2. The laser beam emitted from the semiconductor laser 1 is focused on the optical fiber 3 through the lens 2. The semiconductor laser 1, the lens 2, and the optical fiber 3 are arranged on a line so as to optimize coupling efficiency.

Reference numeral 4 denotes a convex board for fixing the semiconductor laser 1, the lens 2, and the like; 5, an electronic cooling element for adjusting the temperature of the semiconductor laser 1; and 6, a module package incorporating the convex board 4, the electronic cooling element 5, and the like and fixing the optical fiber 3. The semiconductor laser 1 is mounted on a heat sink 11. The heat sink 11 is soldered and fixed on the upper surface of the convex board 4. A lens holder 7 for fixing the lens 2 is welded and fixed on the upper surface of the convex board 4 by a YAG (Yttrium Aluminum Garnet) laser. The convex board 4 is soldered and fixed on the upper surface of the electronic cooling element 5. The electronic cooling element 5 is soldered and fixed to the bottom surface in the module package 6. The optical fiber 3 is welded and fixed to a fiber holder 10 by the YAG laser. The fiber holder 10 is welded and fixed to the module package 6 by the YAG laser.

In recent years, in an optical fiber transmission unit, strong demand has arisen for a low-profile semiconductor laser module as a signal source to attain a high packaging density. As described above, in the conventional semiconductor module, the semiconductor laser 1, the lens 2, and the optical fiber 3 are arranged on a line, and at the same time, the semiconductor laser 1 and the lens 2 are mounted on the electronic cooling element 5. For this reason, the height of the module package 6 is determined by the heights of the lens 2, the convex board 4, the electronic cooling element 5, and the like which are constituent components of the module package 6.

As one method of reducing the height of the module package 6, the constituent components of the module package 6 must be made compact.

There are limitations in making the constituent components compact. For example, to efficiently couple a laser beam emitted from the semiconductor laser 1 to the optical fiber 3 focused by the lens 2, the NA (Numerical Aperture) for the laser beam incident on the lens 2 must be increased. A decrease in lens diameter while the NA is kept large has physical limitations. In the convex board 4, the strength and thickness of a portion on which the lens holder 7 is disposed have a lower limitation. This portion must have a predetermined thickness or more. In addition, when the height of the electronic cooling element 5 is reduced, the cooling capacity is decreased.

As described above, in the conventional semiconductor laser module, its height cannot be reduced due to the dimensional limitations of the lens 2, the lens holder 7, the convex board 4, and the electronic cooling element 5, which are the constituent components of the laser module, and due to the mounting structure in which these components are mounted on the electronic cooling element 5.

As a conventional low-profile photosemiconductor module, for example, Japanese Patent Laid-Open No. 5-226779 proposes a low-profile structure in which a temperature adjustment electronic cooling element (Peltier cooler element) is directly assembled on the bottom surface of a package to eliminate a board below the Peltier cooler element, thereby reducing the thickness of the board portion. Japanese Patent Laid-Open No. 5-150146 proposes a low-profile, deformation-resistant structure in which thick-wall portions are disposed at both sides of a board in a direction parallel to an optical axis to reduce the thickness of the board without degrading the bending stress in the optical axis. Still another conventional structure is proposed in which a groove is formed in the bottom portion of a package to reduce the total thickness of an electronic cooling element and the components of an optical coupling system, all of which are disposed in the groove, thereby obtaining a low-profile module. In all the conventional structures, as shown in FIG. 3, a lens holder is fixed on a board. Therefore, the problem of effectively reducing overall module height is left unsolved.

SUMMARY OF THE INVENTION

It is an object of the present invention to provide a low-profile semiconductor laser module capable of attaining a high packing density.

In order to achieve the above object according to the present invention, there is provided a semiconductor laser module comprising a flat board, a semiconductor laser mounted on the board to emit a laser beam, a lens for focusing the laser beam from the semiconductor laser, an optical fiber optically coupled to the lens to receive the laser beam emitted from the semiconductor laser and focused by the lens, a lens holder for holding the lens on an optical axis of the semiconductor laser, an electronic cooling element for adjusting a temperature of the semiconductor laser, the board being fixed to an upper surface of the electronic cooling element, and support means for supporting the lens holder at a position opposing a light-exit end face of the board which is perpendicular to the optical axis.

BRIEF DESCRIPTION OF THE DRAWINGS

FIG. 1 is a sectional view of a semiconductor module according to an embodiment of the present invention;

FIG. 2 is a plan view of the board portion of the semiconductor laser shown in FIG. 1.

DESCRIPTION OF THE PREFERRED EMBODIMENT

Figure 3:
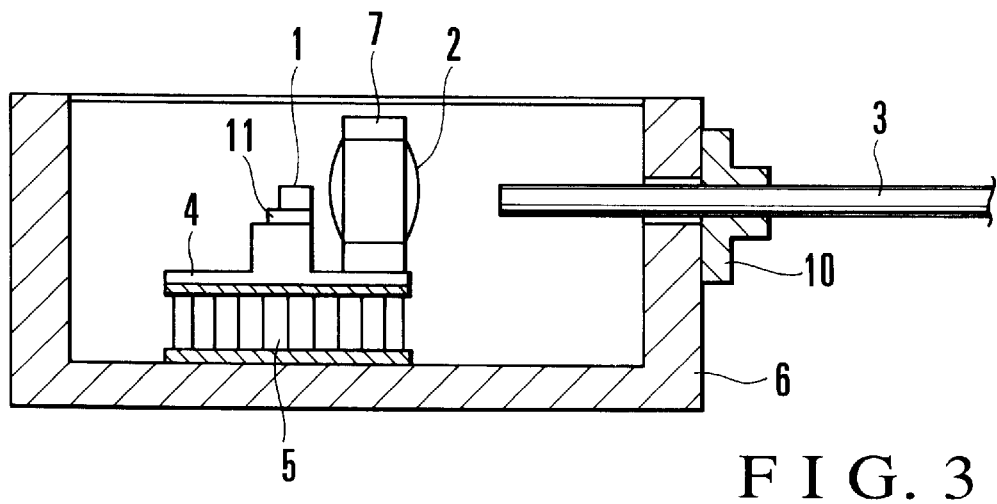
FIG. 3 is a sectional view of a conventional semiconductor module.

The embodiment of the present invention will be described in detail, with reference to the accompanying drawings.

FIG. 1 shows a semiconductor laser module according to an embodiment of the present invention. Referring to FIG. 1, reference numeral 101 denotes a semiconductor laser for emitting a laser beam; 102, a lens for focusing the beam emitted from the semiconductor laser 101; 107, a lens holder having a pair of ear members 107a for holding the lens 102;

108, a pair of metal support rods disposed parallel to the optical axis to fix and hold the lens holder 107; 103, an optical fiber to which the beam emitted from the semiconductor laser 101 and focused by the lens 102 is coupled; 109, a flat board on which the semiconductor laser 101 and the support rods 108 are fixed; 105, an electronic cooling element comprised of a Peltier cooler element for adjusting the temperature of the semiconductor laser 101; and 106, a box-like module package incorporating the board 109 and the electronic cooling element 105 and fixing the optical fiber 103.

As shown in FIG. 2, the semiconductor laser 101 is mounted on a cooling heat sink 111 and soldered and fixed to the upper surface of the board 109. The board 109 is soldered and fixed to the upper portion of the electronic cooling element 105. One end of each of the pair of metal rods 108 disposed parallel to the optical axis is welded and fixed to the board 109 by YAG laser welding. The other end of each of the metal rods 108 projects from the board 109 in the light exit direction The ear members 107a of the lens holder 107 are fixed to the projecting ends of the metal rods 108, respectively. The lens 102, disposed on the exit optical axis of the semiconductor laser 101, is fixed to the lens holder 107. The electronic cooling element 105 is soldered and fixed to the bottom surface of the module package 106. A fiber holder 110 is welded and fixed by YAG laser welding to the outer side surface of the module package 106 in the light exit direction. The optical fiber 103 is welded and fixed to the fiber holder 110 by YAG laser welding and held thereby.

As shown in FIG. 2, the two metal rods 108, disposed parallel to the optical axis at the two sides of the lens holder 107 and holding the lens holder 107, are fixed at positions which do not interfere with electrical wiring of the semiconductor laser 101 on the board 109, i.e., along the two opposing sides parallel to the optical axis.

As shown in FIG. 1, the lens holder 107 is supported by the metal rods 108 outside the board 109 at a position where the lower end portion of the lens holder 107 is lower than the upper surface of the electronic cooling element 105. Therefore, the height of the optical axis of the lens 102 is determined by the combined stacking heights of the electronic cooling element 105, the board 109, and the heat sink 111, offset by the lowering achieved by the lens holder 107 and the metal rods 108.

The central position of the lens 102 held by the lens holder 107 is lowered, and the height of the optical path of the beam emitted from the semiconductor laser 101 can be lowered. For this reason, the positions of the semiconductor laser 101 and the optical fiber 103 and the height of the module package 106 can be lowered. As a result, the height of the semiconductor laser module can be lowered, thereby obtaining a low-profile laser module.

The present invention is not limited to the above embodiment. Various changes and modifications and equivalent theories which comply with the principle of the present invention are incorporated in the present invention. For example, in the above embodiment, the metal rods welded and fixed with the YAG laser are used and fixed to the lens holder and the board. However, the present invention is not limited to this. A material other than a metal may be used with any other fixing method.

As has been described above, in the semiconductor laser module of the present invention, the height of the semiconductor laser module can be greatly reduced without reducing the sizes of constituent components such as a lens, a board, and an electronic cooling element.

What is claimed is:

1. A semiconductor laser module comprising:

a flat board;

a semiconductor laser mounted on said board, wherein said semiconductor laser emits a laser beam;

a lens for focusing the laser beam from said semiconductor laser;

an optical fiber optically coupled to said lens, wherein said optical fiber receives the laser beam emitted from said semiconductor laser and focused by said lens;

a lens holder for holding said lens on an optical axis of said semiconductor laser;

an electronic cooling element for adjusting a temperature of said semiconductor laser, said board being fixed to an upper surface of said electronic cooling element; and support means for supporting said lens holder at a position opposing a light-exit end face of said board, wherein said support means is fixably mounted to said board.

2. A module as claimed in claim 1, wherein said support means supports said lens holder at a position where a lower end portion of said lens holder is lower than an upper surface of said board, and wherein said semiconductor laser, said lens, and said optical fiber are disposed on the same optical axis.

3. A module as claimed in claim 1, wherein said lens holder has two side portions, and wherein said support means comprises a pair of rod-like members disposed parallel to each other along the optical axis, said rod-like members having first end portions fixed on said board and second end portions fixed to said two side portions of said lens holder, and wherein said two side portions of said lens holder are supported by said second end portions of said rod-like members.

4. A module as claimed in claim 3, wherein said rod-like members are disposed along two opposing sides of said board so as to interpose the optical path of the exit laser beam from said semiconductor laser beam.

5. A module as claimed in claim 3, wherein said rod-like members are made of a metal and welded and fixed by YAG laser to said lens holder and said board.

6. A module as claimed in claim 1, further comprising a cooling heat sink fixed on said board and on which said semiconductor laser is mounted, wherein the height of the optical axis of said lens is determined by the combined stacking heights of said electronic cooling element, said board, and said heat sink.

* * * * *